(12) United States Patent
Kuriyama

(10) Patent No.: US 6,362,019 B1
(45) Date of Patent: Mar. 26, 2002

(54) SOLID-STATE IMAGING DEVICE AND MANUFACTURING METHOD THEREFOR

(75) Inventor: Toshihiro Kuriyama, Shiga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/534,865

(22) Filed: Mar. 24, 2000

Related U.S. Application Data

(62) Division of application No. 09/290,122, filed on Apr. 12, 1999.

(30) Foreign Application Priority Data

Apr. 22, 1998 (JP) .......................................... 10-112238
Aug. 21, 1998 (JP) .......................................... 10-235827

(51) Int. Cl.[7] .......................................... H01L 21/339
(52) U.S. Cl. .......................... 438/60; 438/78; 438/546
(58) Field of Search .......................... 438/60, 75, 78, 438/144, 527, 545, 546

(56) References Cited

U.S. PATENT DOCUMENTS

| | | | |
|---|---|---|---|
| 5,288,656 A | * 2/1994 | Kusaka et al. ................ | 438/78 |
| 5,637,891 A | 6/1997 | Lee ............................. | 257/215 |
| 5,877,521 A | 3/1999 | Johnson et al. ............. | 257/223 |
| 5,892,253 A | 4/1999 | Merrill ....................... | 257/292 |
| 5,920,092 A | 7/1999 | Watanabe ................... | 257/292 |
| 5,936,270 A | 8/1999 | Kamada ..................... | 257/291 |
| 6,023,081 A | * 2/2000 | Drowley et al. ............ | 257/292 |
| 6,136,629 A | * 10/2000 | Sin .............................. | 438/75 |

FOREIGN PATENT DOCUMENTS

| | | | |
|---|---|---|---|
| JP | 6-89995 | * | 3/1994 |
| JP | 9-247546 | | 9/1997 |

* cited by examiner

*Primary Examiner*—Chandra Chaudhari
(74) *Attorney, Agent, or Firm*—Merchant & Gould P.C.

(57) ABSTRACT

A solid-state imaging device comprises a plurality of pixels, each pixel comprising a semiconductor substrate of a first conductivity type; a photo-receiving portion of a second conductivity type formed in the semiconductor substrate; a detecting portion of the second conductivity type formed in the semiconductor substrate; an insulating film formed on the semiconductor substrate; a transfer gate electrode formed on the insulating film at lest between the photo-receiving portion and the detecting portion; and a read-out circuit, which is electrically connected to the detecting portion. A diffusion region of the same conductivity type as the detecting portion is formed in a region of the semiconductor substrate that is adjacent to an end of the detecting portion near the gate electrode and separate from the photo-receiving portion. An impurity concentration in the photo-receiving portion and an impurity concentration in the diffusion region are lower than an impurity concentration in the detecting portion. With this solid-state imaging device and with the method for producing the same, a solid-state imaging device is provided that reduces crystal defects in the photo-receiving portion and improves the output image quality.

19 Claims, 11 Drawing Sheets

4
SOLID-STATE IMAGING DEVICE AND MANUFACTURING METHOD THEREFOR

This application is a Divisional of application Ser. No. 09/290,122, filed Apr. 12, 1999, which application(s) are incorporated herein by reference.

FIELD OF THE INVENTION

The present invention relates to a MOS (metal oxide semiconductor) solid-state imaging device using MOS transistors for reading a signal and to a method of manufacturing the same.

BACKGROUND OF THE INVENTION

Solid-state imaging devices are generally classified into two categories according to the method by which a signal is read: CCD devices, which use CCDs (charged coupled devices) to transfer signal charge and read a signal simultaneously from a plurality of pixels, and MOS devices, which use read-out circuits comprising MOS transistors, formed for each pixel, to read a signal by selecting one pixel after the other.

In recent years, MOS solid-state imaging devices, especially CMOS devices that are produced with a CMOS (complementary MOS) process, have received great attention as image input elements for portable imaging apparatus such as small PC cameras. Because they can be driven with low voltage and low power consumption, and they can be integrated on one chip together with peripheral circuits.

MOS solid-state imaging devices in turn are classified into two categories according to the read-out circuit that is formed for each pixel: passive devices, which directly read the signal charge that accumulates in a photo-receiving portion into an output line, and active devices, which amplify the potential difference that occurs due to the accumulation of the signal charge with an amplifying circuit before giving it out. FIGS. 9 and 10 are cross-sectional drawings showing structures of pixels in conventional MOS solid-state imaging devices. FIG. 9 shows a pixel in an active solid-state imaging device. The signal charge is transferred from the photo-receiving portion to a detecting portion. The potential difference occurring at the detecting portion is given out. Each pixel comprises a photo-receiving portion and four transistors: a charge transfer transistor, an amplify transistor, a reset transistor and a select transistor. The charge transfer transistor is a MOS transistor consisting of a photo-receiving portion 73a and a detecting portion 74a formed in a silicon substrate 70, an insulating film 71 formed on the silicon substrate, and a gate electrode 72 formed on the insulating film 71 at least between the photo-receiving portion 73a and the detecting portion 74a. The photo-receiving portion 73a corresponds to the source and the detecting portion 74a corresponds to the drain of the charge transfer transistor. FIG. 10 shows a pixel in an active solid-state imaging device giving out the potential difference occurring at the photo-receiving portion. Each pixel comprises a photo-receiving portion and three transistors: an amplify transistor, a reset transistor and a select transistor. The reset transistor is a MOS transistor consisting of a photo-receiving portion 83a and a charge drain portion 84a formed in a silicon substrate 80, an insulating film 81 formed on the silicon substrate, and a gate electrode 82 formed on the insulating film 81 at least between the photo-receiving portion 83a and the charge drain portion 84a. The photo-receiving portion 83a corresponds to the source and the charge drain portion 84a corresponds to the drain of the reset transistor.

As in regular MOS transistors, the MOS transistors in these MOS solid-state imaging devices have a lightly doped drain (LDD) structure, comprising a diffusion region with a low impurity concentration at the end of the drain region near the gate electrode (referred to as "LDD portion" in the following), to suppress deterioration of the element properties due to a concentration of the electric field near the drain. This LDD structure is also used in MOS transistors taking the photo-receiving portion for the source. For example, in the solid-state imaging device shown in FIG. 9, an LDD portion 74b is formed at the end of the detecting portion 74a, which corresponds to the drain of the charge transfer transistor, near the gate electrode. And in the solid-state imaging device shown in FIG. 10, an LDD portion 84b is formed at the end of the charge drain portion 84a, which corresponds to the drain of the reset transistor, near the gate electrode.

Furthermore, in a conventional MOS solid-state imaging device such as the one shown in FIG. 9 or FIG. 10, a diffusion region with a low impurity concentration (in FIG. 9, this is the region 73b, and in FIG. 10, this is the region 83b) is formed at the end of the photo-receiving portion near the gate electrode.

FIG. 11 illustrates a method for manufacturing a conventional solid-state imaging device with LDD structure such as the one shown in FIG. 9. First, impurity ions are implanted into the silicon substrate 70, whereon the insulating film 71 and the gate electrode 72 have been formed, to form the photo-receiving portion 73a, the LDD portions, and the detecting portion (FIG. 11(a)). However, at this stage the impurity concentration in the detecting portion is low and roughly equal to the impurity concentration in the LDD portions. Then, a silicon oxide film 75 is deposited (FIG. 11(b)). A portion of this silicon oxide film 75 is then removed by plasma etching (FIG. 11(c)). Silicon oxide films 75a and 75b remain on both sides of the gate electrode. Then, using the remaining silicon oxide films 75a and 75b as masks, ions are implanted again, to increase the impurity concentration in the photo-receiving portion 73a and the detecting portion 74a (FIG. 11(d)).

However, in solid-state imaging devices that are manufactured with the method explained above, the quality of the output image can deteriorate due to crystal defects in the photo-receiving portion, appearing as white marks for example.

SUMMARY OF THE INVENTION

It is an object of the present invention to provide a solid-state imaging device with superior quality of the output image and a method for manufacturing such a solid-state imaging device.

In order to achieve this object, a solid-state imaging device in accordance with the present invention comprises a plurality of pixels, each pixel comprising a semiconductor substrate of a first conductivity type; a photo-receiving portion of a second conductivity type formed in the semiconductor substrate; a first diffusion region of the second conductivity type formed in the semiconductor substrate; a first insulating film formed on the semiconductor substrate; a gate electrode formed on the first insulating film at least between the photo-receiving portion and the first diffusion region; a read-out circuit, which is electrically connected to one of the photo-receiving portion and the first diffusion region; and a second diffusion region of the second conductivity type formed in the semiconductor substrate, which is adjacent to an end of the first diffusion region near the gate electrode and separate from the photo-receiving portion. An impurity concentration in the photo-receiving portion and an impurity concentration in the second diffusion region are lower than an impurity concentration in the first diffusion region.

In this specification, the term of "impurity concentration" means the concentration of the impurities that give the desired conductivity characteristic to the region of the substrate where the impurities have been implanted.

In a conventional solid-state imaging device, the impurity concentration in the photo-receiving portion is equal to the impurity concentration in the drain region of the transistor having the photo-receiving portion as the source (in FIG. 9, this is the detecting portion 74a and in FIG. 10, this is the charge drain portion 84a). Consequently, the photo-receiving portion may be damaged by the ion implantation for achieving such a high impurity concentration, which can deteriorate the quality of the output image.

On the other hand, in a solid-state imaging device according to the present invention, the impurity concentration in the photo-receiving portion is low, so that the damage inflicted upon the photo-receiving portion during the ion implantation for forming the photo-receiving portion is low, and white marks appearing on the output image can be suppressed. This improves the image quality of the output image.

It is preferable that the impurity concentration in the photo-receiving portion is lower than the impurity concentration in the second diffusion region. Because the impurity concentration in the photo-receiving portion of such a configuration is even lower, a good picture quality can be attained with more certainty.

It is preferable that each pixel further comprises a second insulating film formed on the first insulating film above the photo-receiving portion. It is even more preferable that the second insulating film covers the photo-receiving portion. However, if the photo-receiving portion has to be electrically connected to the read-out circuit, an aperture portion should be provided in the second insulating film through which the read-out circuit can contact the photo-receiving portion.

It is preferable that each pixel further comprises a third diffusion region of the first conductivity type formed at an upper portion of the photo-receiving portion in the semiconductor substrate. Since this reduces dark currents, a good picture quality can be attained with more certainty.

It is preferable that impurity concentration in the first diffusion region is at least $10^{20} cm^{-3}$.

It is also preferable that the impurity concentration in the photo-receiving portion is $10^{15} cm^{-3}$ to $10^{19} cm^{-3}$.

It is also preferable that the impurity concentration in the second diffusion region is $10^{18} cm^{-3}$ to $10^{19} cm^{-3}$.

Moreover, it is preferable that the read-out circuit comprises an amplify transistor for amplifying an electrical signal corresponding to the light that is irradiated onto the photo-receiving portion. Thus, the output sensitivity of the signal can be increased.

An example for a pixel in such a solid-state imaging device is a pixel where the first diffusion region is electrically connected to the gate electrode of the amplify transistor. Another example for a pixel in such a solid-state imaging device is a pixel where the photo-receiving portion is electrically connected to the gate electrode of the amplify transistor and the first diffusion region is electrically connected to a terminal of a voltage source.

In a method for manufacturing a solid-state imaging device comprising a plurality of pixels in accordance with the present invention, wherein each pixel comprises a semiconductor substrate of a first conductivity type; a photo-receiving portion of a second conductivity type formed in the semiconductor substrate; a first diffusion region of the second conductivity type formed in the semiconductor substrate; a first insulating film formed on the semiconductor substrate; a gate electrode formed on the first insulating film at least between the photo-receiving portion and the first diffusion region; a read-out circuit, which is electrically connected to one of the photo-receiving portion and the first diffusion region; the method comprises forming the gate electrode on the first insulating film, which is located above the semiconductor substrate; implanting ions into the semiconductor substrate using the gate electrode as a mask to form the photo-receiving portion and a second diffusion region of the second conductivity type including a region that corresponds to the first diffusion region; forming a second insulating film above the semiconductor substrate; etching the second insulating film in a manner that the second insulating film remains above the photo-receiving portion and above a region of the substrate including an end of the second diffusion region near the gate electrode; and implanting ions as impurities of the second conductivity type into the second diffusion region using the remaining second insulating film as a mask to form the first diffusion region.

Conventional methods for manufacturing a solid-state imaging device employ plasma etching for etching the insulating film (etching the silicon oxide film 75 as in FIG. 11(c)). However, this leads to damage such as crystal defects, since the photo-receiving portion is directly exposed to the plasma, and such damage causes deterioration of the quality of the output image. Moreover, as has been mentioned before, the ion implantation for providing the photo-receiving portion with the same impurity concentration as the drain region (i.e. the detecting portion 74a in FIG. 9 and the charge drain portion 84a in FIG. 10) also inflicts damage upon the photo-receiving portion.

On the other hand, with the manufacturing method in accordance with the present invention, insulating film remains above the photo-receiving portion when the insulating film is etched, so that damage of the photo-receiving portion due to the etching can be avoided. Moreover, during the ion implantation for forming the first diffusion region, the insulating film covers the photo-receiving portion, so that damage of the photo-receiving portion due to the ion implantation can be reduced.

Another method for manufacturing a solid-state imaging device in accordance with the present invention comprises forming a gate electrode on a first insulating film, which is located above a semiconductor substrate having a first conductivity type; implanting ions into the semiconductor substrate using the gate electrode as a mask, to form a photo-receiving portion of a second conductivity type on a first side of the gate-electrode, and to form a second diffusion region of the second conductivity type on a second side of the gate-electrode; forming a second insulating film above the semiconductor substrate; etching the second insulating film in a manner that the second insulating film remains above the photo-receiving portion and above a region of the substrate including an end of the second diffusion region near the gate electrode; and implanting ions into the second diffusion region using the remaining second insulating film as a mask to form a first diffusion region with an impurity concentration that is higher than an impurity concentration in the photo-receiving portion. Also according to this manufacturing method, damage of the photo-receiving portion due to etching can be avoided, and damage of the photo-receiving portion due to ion implantation can be reduced.

It is preferable that the impurity concentration in the photo-receiving portion is adjusted to be lower than the impurity concentration in the second diffusion region. This can reduce the damage of the photo-receiving portion due to ion implantation even further.

It is preferable that the method further comprises forming a third diffusion region of the first conductivity type formed at an upper portion of a region in the semiconductor substrate that corresponds to the photo-receiving portion. This reduces dark currents, so that a good picture quality can be attained with more certainty.

It is preferable that forming the second insulating film is performed in a manner that the thickness of the second insulating film is 150 nm to 250 nm.

It is preferable that etching the second insulating film is performed by dry-etching.

It is preferable that the impurity concentration in the first diffusion region is at least $10^{20} cm^{-3}$.

It is preferable that the impurity concentration in the photo-receiving portion is $10^{15} cm^{-3}$ to $10^{19} cm^{-3}$.

It is preferable that the impurity concentration in the second diffusion region is $10^{18} cm^{-3}$ to $10^{19} cm^{-3}$.

DESCRIPTION OF THE PREFERRED EMBODIMENTS

In the solid-state imaging device of the present invention, there is no particular limitation regarding the circuit arrangement of the pixels, as long as each pixel comprises a semiconductor substrate, a photo-receiving portion, a diffusion region, a gate electrode formed above the semiconductor substrate at least between the photo-receiving portion and the diffusion region, and a read-out circuit connected to the photo-receiving portion or to the diffusion region. The solid-state imaging device can be of the passive type or the active type. In the following, examples are given, wherein the present invention is applied to an active solid-state imaging device. The following non-limiting examples illustrate the preferred embodiments of the present invention in conjunction with the accompanying drawings.

First Embodiment

Figure 1:
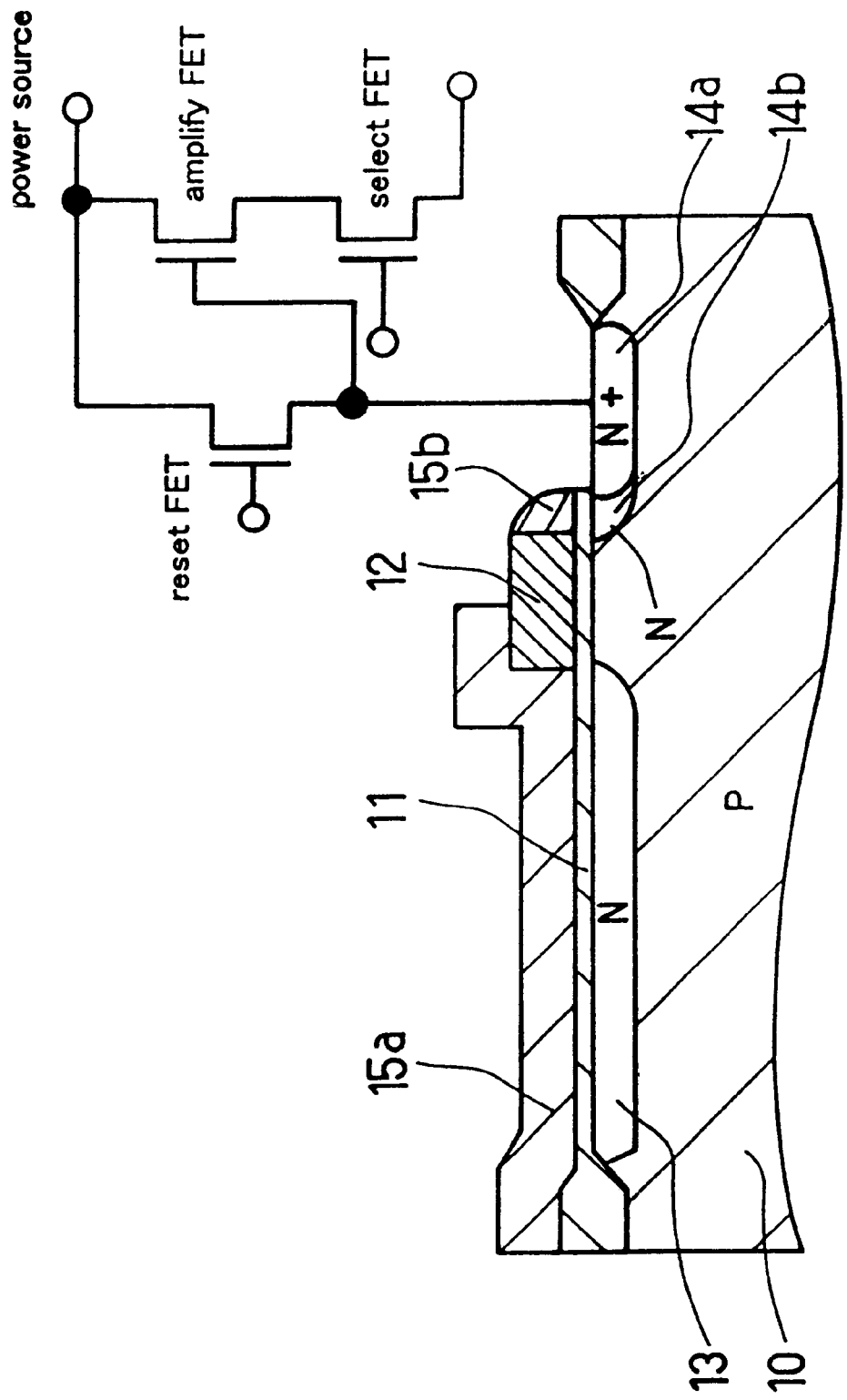
FIG. 1 is a cross-sectional drawing of an example of a solid-state imaging device in accordance with a first embodiment of the present invention.

FIG. 1 is a cross-sectional drawing of an example of a solid-state imaging device in accordance with a first embodiment of the present invention. This solid-state imaging device transfers a signal charge from a photo-receiving portion to a detecting portion, and gives out the potential difference occurring at the detecting portion. Each pixel comprises a photo-receiving portion 13 and four transistors: a charge transfer transistor, an amplify transistor, a reset transistor and a select transistor. The charge transfer transistor takes the photo-receiving portion 13 as the source. The drain of the charge transfer transistor is a diffusion region 14a, which is electrically connected to the gate of the amplify transistor. The drain of the amplify transistor is connected to the source of the select transistor, and the source of the amplify transistor is connected to a power-source voltage. The source of the reset transistor is connected to the diffusion region 14a, and the drain of the reset transistor is connected to the power-source voltage. The drain of the select transistor is connected to an output line.

The following is an outline of the role of each transistor. The charge transfer transistor transfers a signal charge, which has been generated in the photo-receiving portion 13 by irradiation of light, to the diffusion region 14a. The diffusion region 14a functions as a detecting portion for holding the signal charge and providing the amplify transistor with a voltage that is proportional to the charge (in the following, the diffusion region 14a is referred to as "detecting portion"). The amplify transistor amplifies the voltage provided by the detecting portion 14a. The select transistor acts as a switch for receiving the output from the amplify transistor, and selects the pixel from which the signal is read out. The read-out circuit in the pixels of this solid-state imaging device is the amplifying circuit comprising the amplify transistor and the select transistor. Moreover, the reset transistor periodically releases the signal charge held by the detecting portion 14a toward the power-source voltage.

The following is a more detailed explanation of the region forming the charge transfer transistor. In this region, the photo-receiving portion and the detecting portion 14a, which are n-type diffusion regions, are formed in the p-type silicon substrate 10. An insulating film 11 is formed on the substrate 10, and the gate electrode 12 (referred to as "transfer gate electrode" in the following) is formed on the insulating film 11 at least between the photo-receiving portion 13 and the detecting portion 14a.

The impurity concentration in the detecting portion 14a should be high enough that an electrical connection with metal wiring can be established, and is typically set to at least $10^{20} cm^{-3}$. A diffusion depth of about 0.2 μm to 0.4 μm is appropriate. Adjacent to the detecting portion 14a on the transfer gate electrode side, a diffusion region 14b with a lower n-type impurity concentration than the impurity concentration in the detecting portion 14a is formed. This region 14b functions as an LDD portion. The impurity concentration in this LDD portion is typically about $10^{18}$–$10^{19}$cm$^{-3}$.

Figure 9:
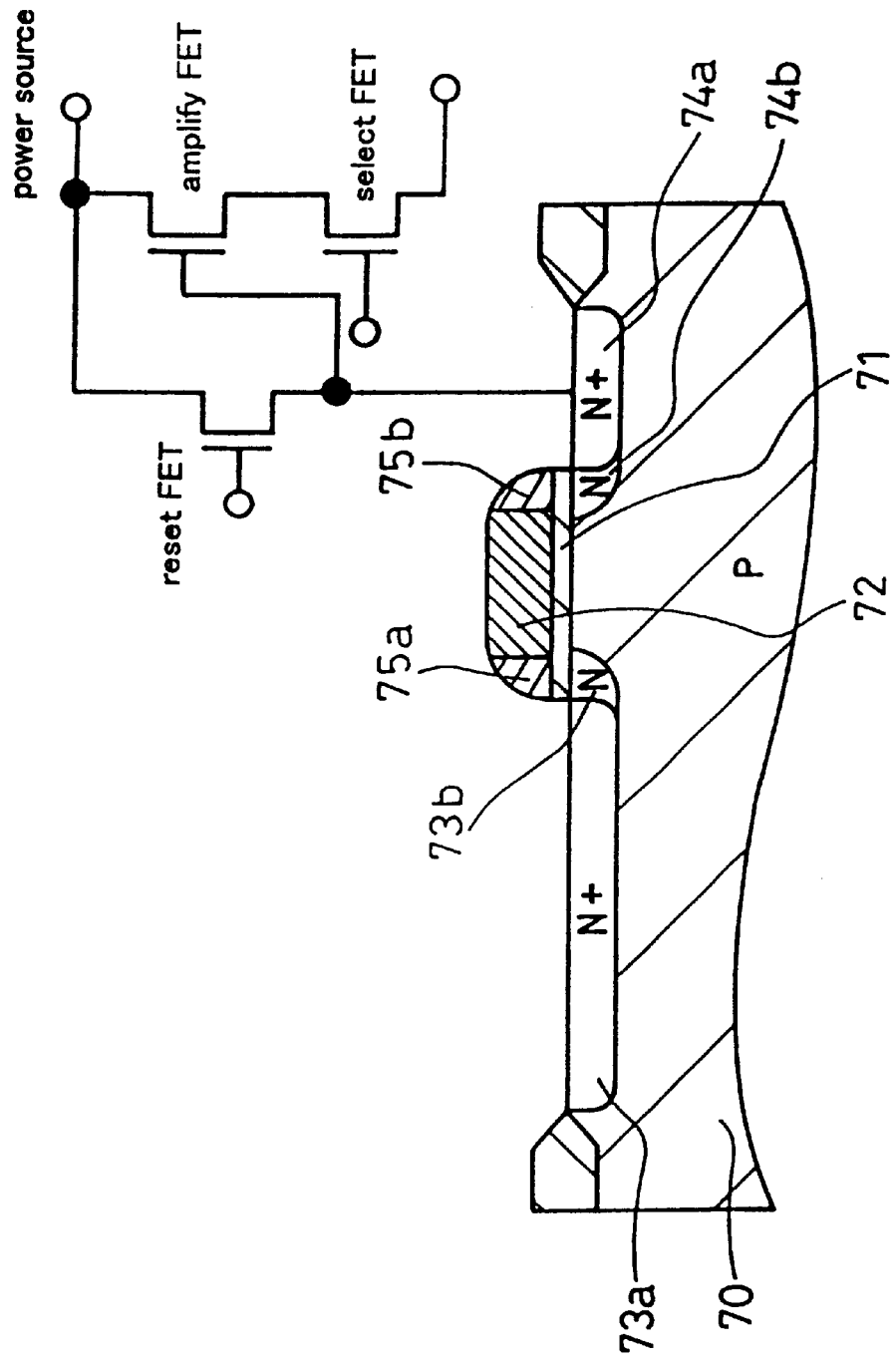
FIG. 9 is a cross-sectional drawing showing an example of a conventional solid-state imaging device.

There is no particular limitation concerning the impurity concentration in the photo-receiving portion 13, other than that it should be suitable for photon-electron conversion. In other words, it is not necessary that the impurity concentration in the photo-receiving portion 13 is the same as the impurity concentration in the detecting portion 14a. For example, in the solid-state imaging device in FIG. 1, the impurity concentration in the photo-receiving portion 13 is adjusted to the same impurity concentration as the LDD portion, about $10^{18}$–$10^{19}$cm$^{-3}$. Moreover, the diffusion depth of the photo-receiving portion 13 in the solid-state imaging device in FIG. 1 is about 0.2–0.4 μm. Furthermore, there is no diffusion region adjacent to an end of the photo-receiving portion 13 that has an impurity concentration that is lower than that of the photo-receiving portion 13 (i.e., corresponding to the region 73b in FIG. 9).

In this solid-state imaging device, a silicon oxide film 15a covers the entire photo-receiving portion 13 and a portion of the transfer gate electrode 12. Furthermore, an interlayer insulating film, a light-blocking film made of metal having an aperture above the photo-receiving portion, and a surface protection film are formed above the substrate (these films are not shown in the drawing).

Figure 2:
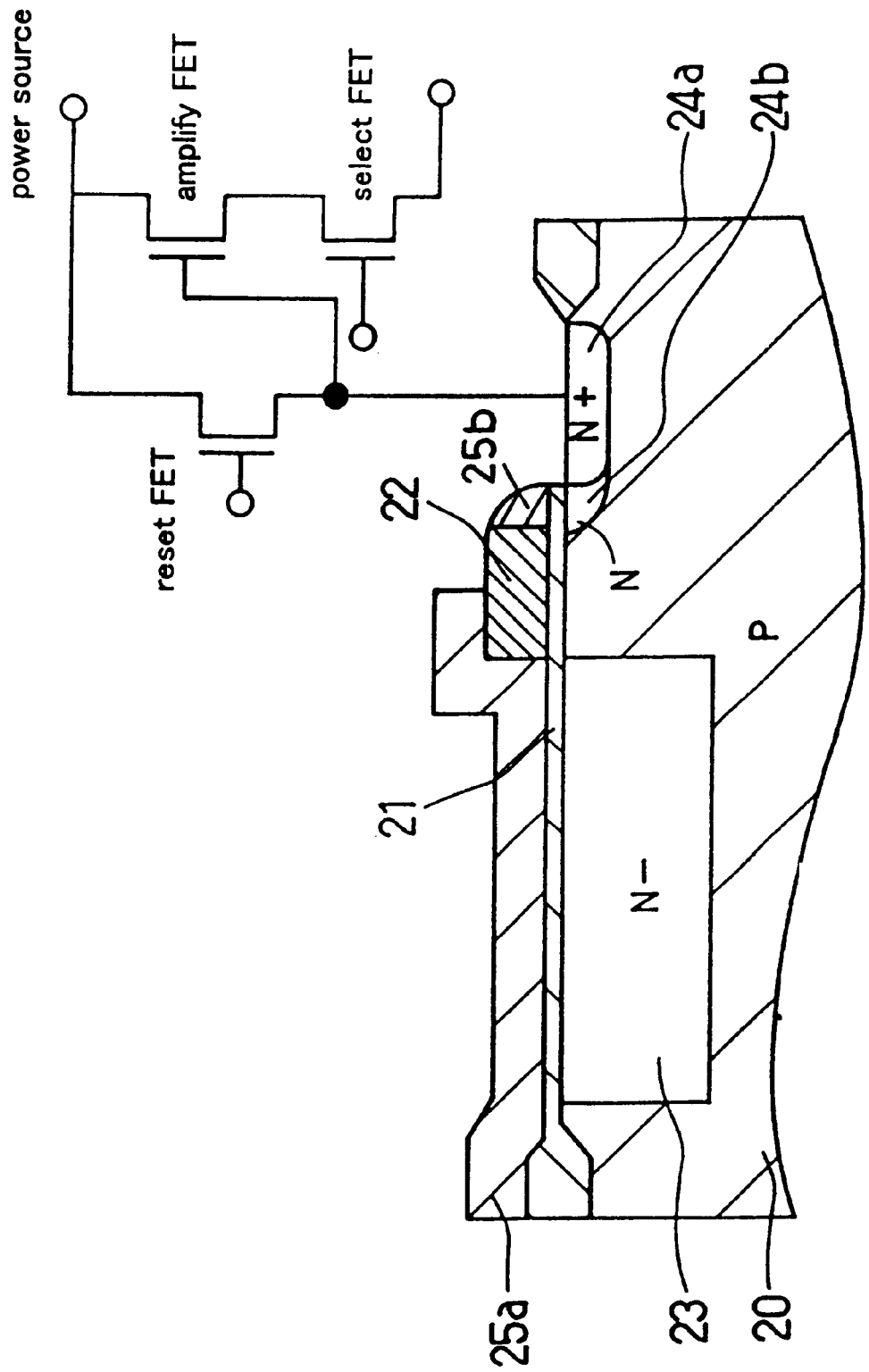
FIG. 2 is a cross-sectional drawing of another example of a solid-state imaging device in accordance with the first embodiment of the present invention.

FIG. 2 shows a more preferable embodiment of a solid-state imaging device in accordance with this embodiment. In this solid-state imaging device, the impurity concentration in the photo-receiving portion 23 is even lower than in the solid-state imaging device shown in FIG. 1. Other than that the impurity concentration in the photo-receiving portion 23 is set to be even lower than the impurity concentration in the LDD portion 24b, the configuration of this solid-state imaging device is the same as the configuration of the solid-state imaging device described in FIG. 1. The impurity concentration in the photo-receiving portion 23 is preferably about $10^{15}$–$10^{16}$cm$^{-3}$. With such an impurity concentration, the photo-receiving portion can be formed with a small ion implantation dose (for example, about $10^{11}$–$10^{12}$cm$^{-2}$), so that the damage inflicted on the substrate at the photo-receiving portion due to the ion implantation can be alleviated and the image quality of the solid-state imaging device can be improved. If the impurity concentration in the photo-receiving portion 23 is set to the value mentioned above, a diffusion depth of 0.5–2.0 μm is preferable.

Figure 3:
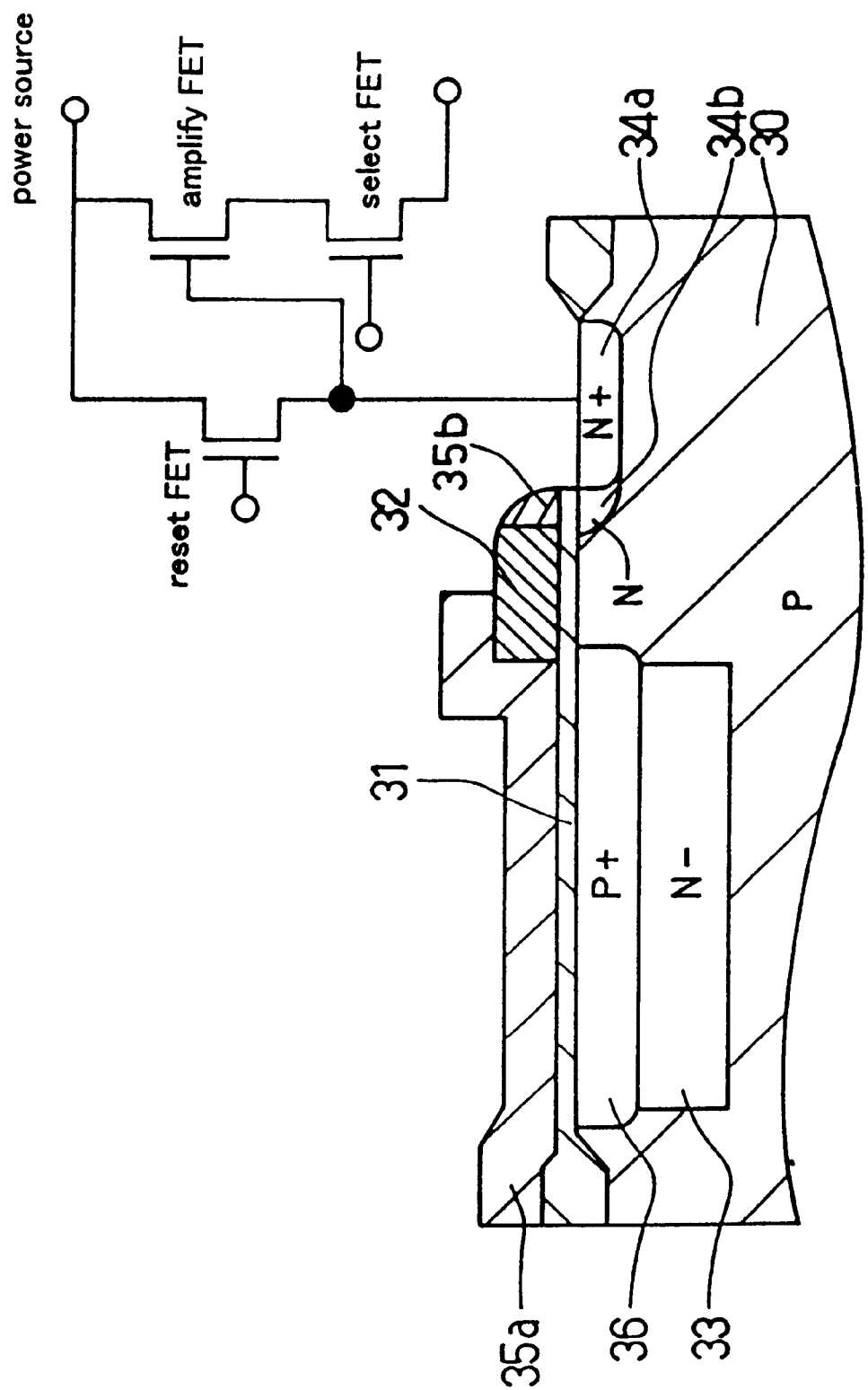
FIG. 3 is a cross-sectional drawing of yet another example of a solid-state imaging device in accordance with the first embodiment of the present invention.

FIG. 3 is a drawing showing an example of another preferable configuration of a solid-state imaging device in accordance with this embodiment. Other than that a p-type diffusion region 36 has been formed at the surface portion of the photo-receiving portion 33, which is an n-type diffusion region, the configuration of this solid-state imaging device is the same as the configuration of the solid-state imaging device described in FIG. 2. When a voltage is applied to the gate electrode, there is the danger that dark currents occur and deteriorate the image quality, because the depletion zone at the substrate surface of the photo-receiving portion widens, especially if the impurity concentration in the photo-receiving portion is low. However, if a p-type diffusion region 36 is provided, these dark currents can be reduced. The impurity concentration in the p-type diffusion region 36 is preferably $10^{17}$–$10^{19}$cm$^{-3}$, and its diffusion depth is preferably 0.2–0.6 μm.

FIGS. 4(a) to (d) illustrate an example of a method for manufacturing a solid-state imaging device in accordance with this embodiment. FIGS. 4(a) to (d) are cross-sectional drawings illustrating the steps for manufacturing the solid-state imaging device shown in FIG. 1. In the following, "detecting portion" means the region 14a in the silicon substrate in FIG. 1, and "LDD portion" means the region 14b in the silicon substrate in FIG. 1.

Figure 4:
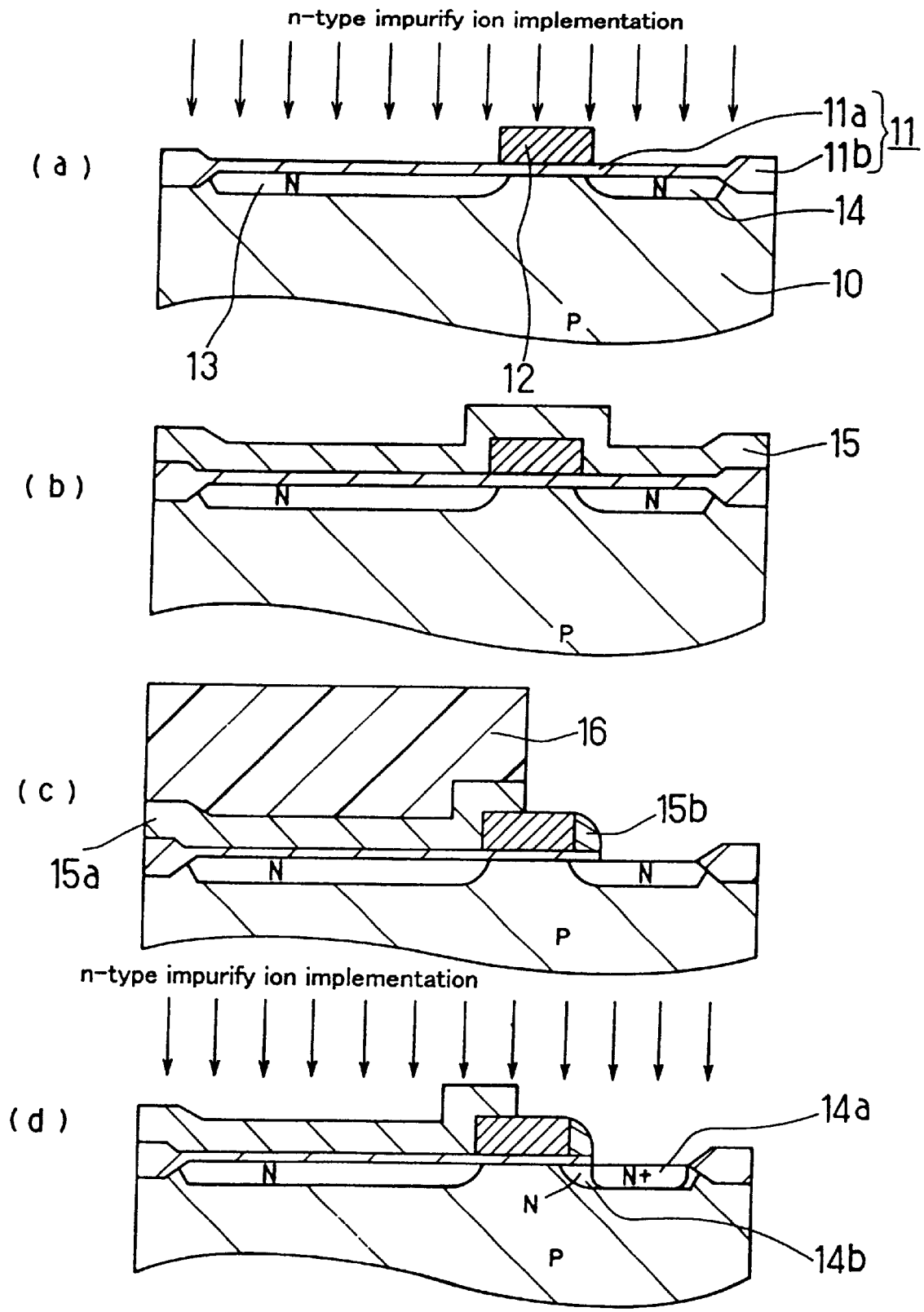
FIGS. 4(a) to 4(d) are cross-sectional drawings illustrating an example of a process for manufacturing a solid-state imaging device in accordance with the first embodiment of the present invention.

First of all, a gate insulating film 11a and a field insulating film 11b (both of which are silicon oxide films) are formed by thermal oxidation of a p-type silicon substrate 10. Preferably, the thickness of the gate insulating film 11a is about 10–20 nm, and the thickness of the field insulating film 11b is about 300–500 nm. The field insulating film 11b can be formed by LOCOS (local oxidation of silicon), that is partial thermal oxidation performed after covering the field portion (the portion forming the element) with a silicon nitride film. In FIG. 4(a), the gate insulating film 11a and the field insulating film 11b are denoted by the numeral 11. Then, a polycrystalline silicon film is formed on the silicon substrate 10 with low-pressure CVD. The thickness of the polycrystalline silicon film is preferably about 250–400 nm. This polycrystalline silicon film is partially removed by etching to form the transfer gate electrode 12.

Then, n-type impurities, such as arsenic and phosphorus, are implanted into the silicon substrate 10 to form the photo-receiving portion 13, the detecting portion and the LDD portion (FIG. 4(a)). In FIG. 4(a), the detecting portion and the LDD portion are denoted by numeral 14. At this stage, the impurity concentration in the detecting portion is lower than the impurity concentration that is finally necessary for electrical wiring, and is preferably about $10^{18}$–$10^{19}$cm$^{-3}$. In other words, at this stage the impurity concentration in the detecting portion is the same as the impurity concentration in the LDD portion. The diffusion depth is preferably about 0.2–0.4 μm. In order to reduce variations of the impurity concentration, the implantation is preferably performed several times while changing the substrate orientations between each implantation. For example, the implantation can be performed at an acceleration field strength of 50–80 keV and an implantation dose of about $2\times10^{13}$cm$^{-2}$, and this can be repeated four times while rotating the substrate 90° between each step.

Then, a silicon oxide film 15 is formed above the silicon substrate 10 (FIG. 4(b)). This oxide film is formed by low-pressure CVD using TEOS (tetraethyl ortho-silicate). Its thickness is preferably 150–250 nm, more preferably about 190 nm.

Then, a portion of the silicon oxide film 15 is removed by dry-etching (plasma etching), such as reactive ion etching (RIE) (FIG. 4(c)). The remaining silicon oxide films 15a and 15b function as masks for the second implantation in a later step. This etching concerns the oxide film formed on the region including the detecting portion and excluding the photo-receiving portion 13. In other words, photo-resist is applied so as to cover the photo-receiving portion 13, and preferably a portion of the transfer gate electrode 12, and etching is performed while protecting the oxide film above the photo-receiving portion 13. Thus, the photo-receiving portion is protected by the photo-resist, and damage inflicted by the etching can be avoided.

The etching is performed in a manner that the oxide film on the region that becomes the detecting portion is removed, and the oxide film on the region that becomes the LDD portion remains. The oxide film 15b above the LDD portion can be maintained without using a special photoresist, just by adjusting conditions such as the etching time. An oxide film formed by breaking down the TEOS under low-pressure is formed substantially homogeneously on all surfaces of the steps formed on the substrate, so that the thickness (measured perpendicularly from the substrate surface) of the oxide film of the portion near the transfer gate electrode (that is, the LDD portion) becomes larger than the thickness at other portions. Thus, if an anisotropic etching technique such as dry etching is used, the oxide film 15b above the LDD portion can be maintained.

After the photo-resist 16 has been removed, another ion implantation is performed (FIG. 4(d)). For this ion implantation, the impurity concentration in the detecting portion 14a is set to the concentration that is necessary for connection with the metal wiring, preferably to at least $10^{20} cm^{-3}$. This ion implantation is performed at an acceleration field strength of 20–30 keV and an implantation dose of $5 \times 10^{15} cm^{-2}$, for example. The impurity concentration in the photo-receiving portion 13 and the LDD portion 14b is of course lower than the impurity concentration in the detecting portion 14a, because they are masked by the silicon oxide films 15a and 15b and not subjected to ion implantation. Moreover, the photo-receiving portion 13 is entirely covered by the silicon oxide film 15a, so that the impurity concentration in the photo-receiving portion 13 is substantially homogenous. After the oxide film 15a above the photo-receiving portion 13 has fulfilled its function as a mask for the ion implantation, it is maintained without removing it, and functions as a part of an interlayer insulating film. Thus, the charge transfer transistor is formed with the above-described steps.

An interlayer insulating film is formed above the silicon substrate whereon the charge transfer transistor has been formed. For this interlayer insulating film, a silicon oxide film formed by low-pressure CVD can be used, for example. Then, after a hole has been formed in the interlayer insulating film above the detecting portion 14a, a metal film of, for example, aluminum is formed. This metal film is patterned by etching to form the metal wiring. The metal wiring connects the detecting portion 14a to the amplify transistor formed in another region of the silicon substrate 10, through the hole in the interlayer insulating film.

Furthermore, a light-blocking film made of metal having an aperture at a portion corresponding to the photo-receiving portion, a surface protection film, etc. are formed as appropriate. Although there are no particular limitations concerning the light-blocking film and the surface protection film, an aluminum film can be used for the light-blocking film, and a silicon nitride film formed by plasma CVD can be used for the surface protection film.

In accordance with this manufacturing method, the photo-receiving portion is protected by photo-resist when etching the silicon oxide film in the step shown in FIG. 4(c), and the photo-receiving portion is not exposed to the plasma, so that crystal defects due to the ion bombardment can be avoided, and the image quality of the resulting solid-state imaging device can be improved. Furthermore, since the photo-receiving portion is protected by a silicon oxide film in the step shown in FIG. 4(d), damage due to the ion implantation during this step can be avoided.

In the above-described manufacturing method, the formation of the photo-receiving portion is performed simultaneously with the formation of the detecting portion (first ion implantation into the detecting portion), but to manufacture a solid-state imaging device as shown in FIG. 2 or 3, it is preferable that the photo-receiving portion and the detecting portion are formed in independent steps. If such a manufacturing method is adopted, the impurity concentration and structure of the photo-receiving portion can be freely decided.

First, n-type impurity ions are implanted into the silicon substrate, whereon a gate insulating film, a field insulating film and a gate electrode have been formed, to form the photo-receiving portion, while the regions that become the detecting portion and the LDD portion are covered with photo-resist. Then, the photo-resist is removed, and after the formed photo-receiving portion is covered with another photo-resist, n-type impurity ions are implanted into the region that becomes the detecting portion and the LDD portion. The ion implantation conditions for forming the detecting portion and the LDD portion can be the same conditions as for the first ion implantation (FIG. 4(a)) in the manufacturing method described above. Then, the photo-resist is removed, an oxide film is formed and etched, and another ion implantation is performed for the detecting portion, as in the steps for the above-described manufacturing method (FIGS. 4(b)–(d)), to make a solid-state imaging device.

The formation of films by thermal oxidation, CVD etc. and the etching in the above-describe manufacturing method can be selected from methods well known in the art.

Second Embodiment

Figure 5:
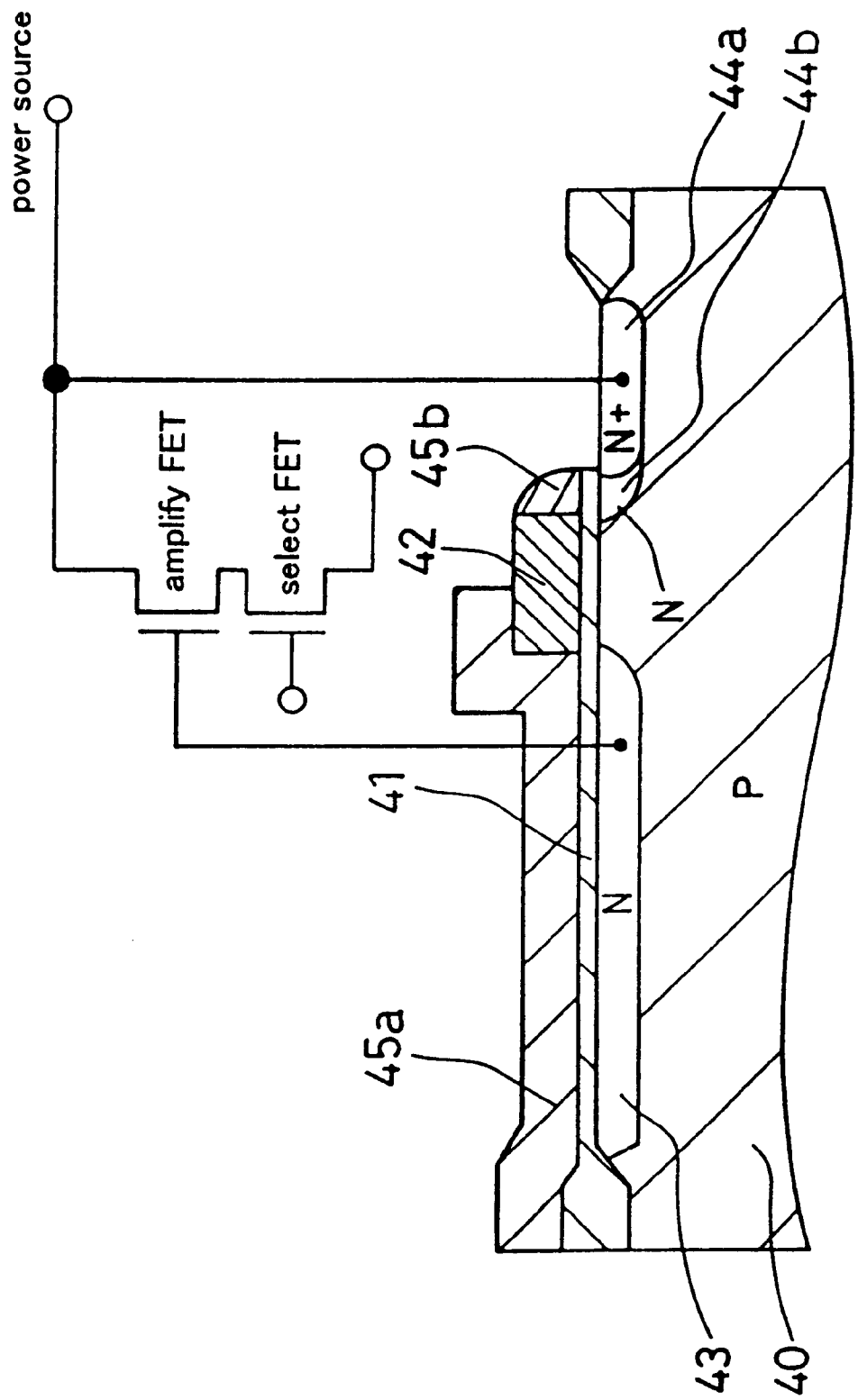
FIG. 5 is a cross-sectional drawing of an example of a solid-state imaging device in accordance with a second embodiment of the present invention.

FIG. 5 is a cross-sectional drawing of another example of a solid-state imaging device in accordance with a second embodiment of the present invention. This solid-state imaging device gives out the potential difference occurring at the photo-receiving portion. Each pixel comprises a photo-receiving portion 43 and three transistors: an amplify transistor, a reset transistor and a select transistor. The reset transistor takes the photo-receiving portion 43 as the source. The drain of the reset transistor is a diffusion region 44a, which is electrically connected to the power-source voltage. The gate of the amplify transistor is connected to the photo-receiving portion 43, the drain of the amplify transistor is connected to the source of the select transistor, and the source of the amplify transistor is connected to the power-source voltage. The source of the select transistor is connected to an output line.

The following is an outline of the role of each transistor. The amplify transistor amplifies the voltage provided by the photo-receiving portion 43 and gives the amplified voltage out over the output line. The select transistor acts as a switch for receiving the output from the amplify transistor, and selects the pixel from which the signal is read out. The read-out circuit in the pixels of this solid-state imaging device is the amplifying circuit comprising the amplify transistor and the select transistor. Moreover, the reset transistor periodically releases the signal charge held by the photo-receiving portion 43 toward the diffusion region 44a, which is connected to the power-source voltage. In other words, the diffusion region 44a functions as a charge drain portion (and is referred to as "charge drain portion" in the following).

The following is an explanation of the region forming the reset transistor as shown in the cross-sectional drawing of FIG. 5, that is, the region including the photo-receiving portion 43, the charge drain portion 44a, and the gate electrode 42 (referred to as "reset electrode"). The configuration of this region is substantially the same as the region forming the charge transfer transistor in the first embodiment.

A photo-receiving portion 43 and a charge drain portion 44a, which are n-type diffusion regions, are formed in a p-type silicon substrate 40. An insulating film 41 is formed on the substrate 40, and a reset gate electrode 42 is formed on the insulating film 41 at least between the photo-receiving portion 43 and the charge drain portion 44a.

The impurity concentration in the charge drain portion 44a should be high enough that an electrical connection with the metal wiring can be established, and is typically set to at least $10^{20}$cm$^{-3}$. A diffusion depth of about 0.2 to 0.4 μm is appropriate. Adjacent to the charge drain portion 44a on the reset gate electrode side, an LDD portion 44b is formed. The impurity concentration in this LDD portion 44b is typically about $10^{18}$–$10^{19}$cm$^{-3}$.

Figure 10:
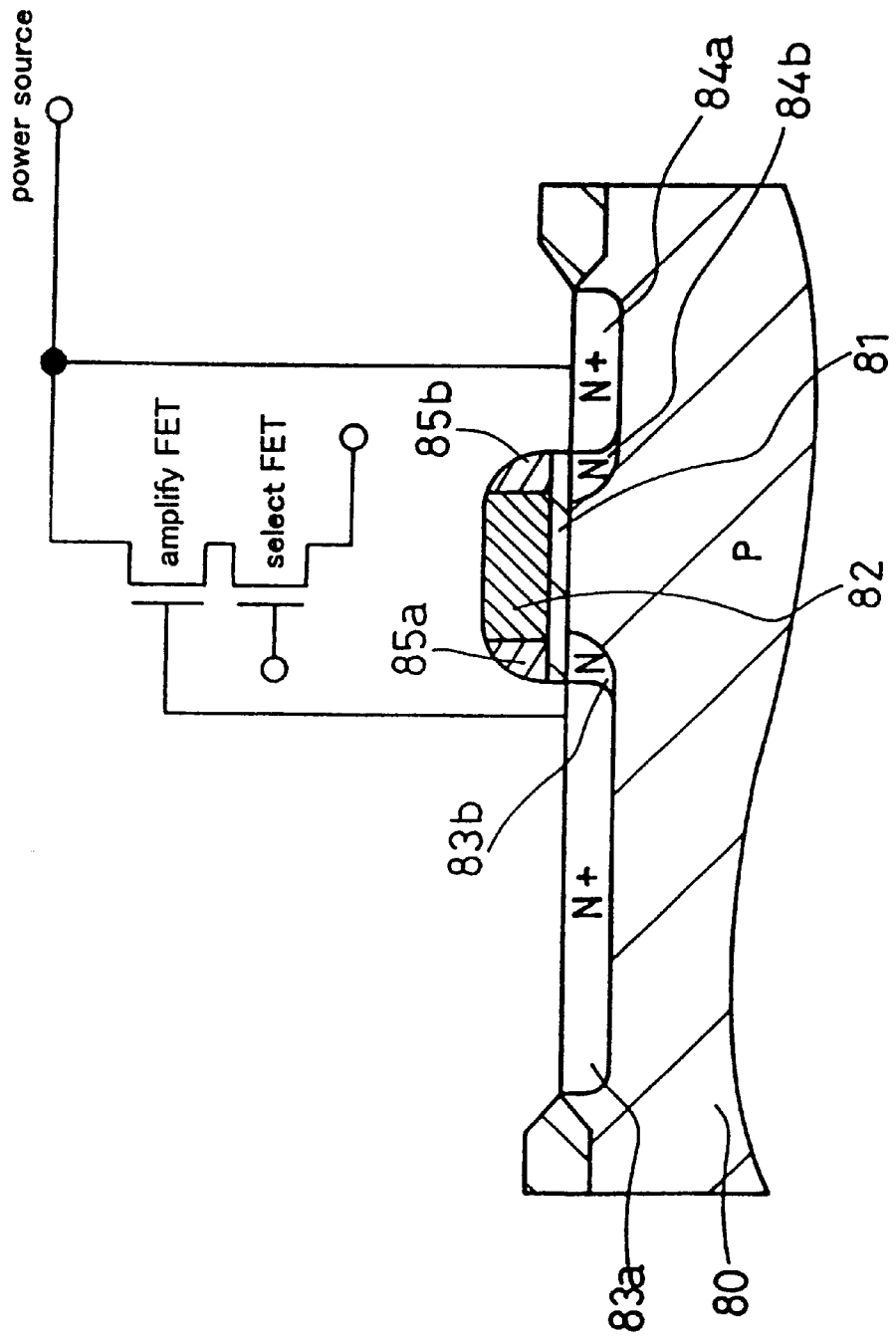
FIG. 10 is a cross-sectional drawing showing another example of a conventional solid-state imaging device.
Figure 11:
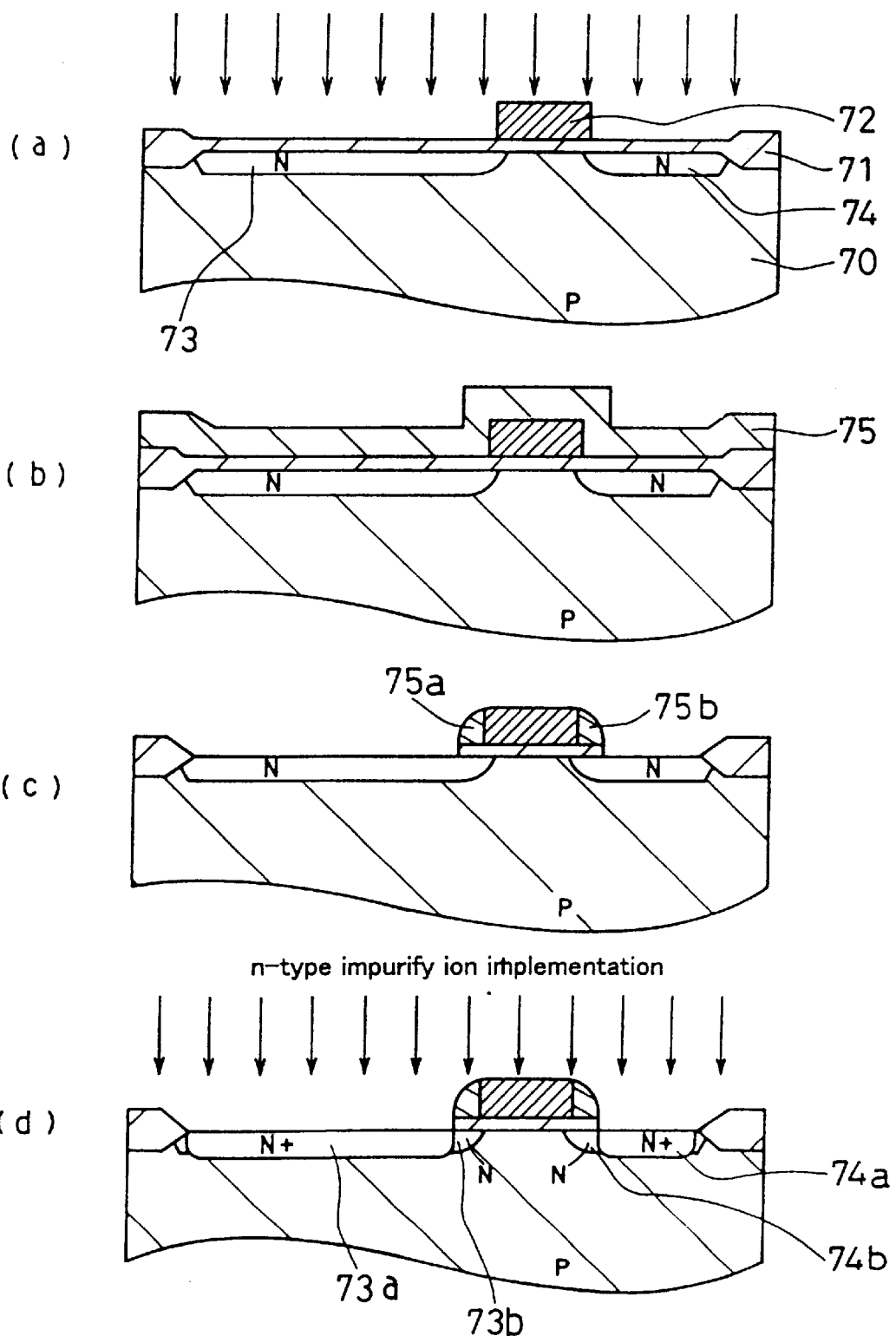
FIGS. 11(a) to 11(d) are cross-sectional drawings illustrating an example of a conventional method for manufacturing a solid-state imaging device.

There is no particular limitation concerning the impurity concentration in the photo-receiving portion 43, other than that it should be suitable for photon-electron conversion and for an electrical connection with the metal wiring. In other words, the impurity concentration in the photo-receiving portion 43 can be lower than the impurity concentration in the charge drain portion 44a, and can be the same as the impurity concentration in the LDD portion, that is about $10^{18}$–$10^{19}$cm$^{-3}$. Moreover, the diffusion depth of the photo-receiving portion 43 in the solid-state imaging device in FIG. 5 is, for example, about 0.2–0.4 μm. Furthermore, there is no diffusion region adjacent to an end of the photo-receiving portion 43 that has a lower impurity concentration (i.e. corresponding to region 83b in FIG. 10).

In this solid-state imaging device, a silicon oxide film 45a covers the photo-receiving portion 43 and a portion of the reset gate electrode 42. However, a hole, through which the photo-receiving portion 43 is contacted with the metal wiring, is formed in the silicon oxide film above the photo-receiving portion 43. Furthermore, an interlayer insulating film, a light-blocking film made of metal having an aperture above the photo-receiving portion, and a surface protection film are formed above the substrate (these films are not shown in the drawing).

Figure 6:
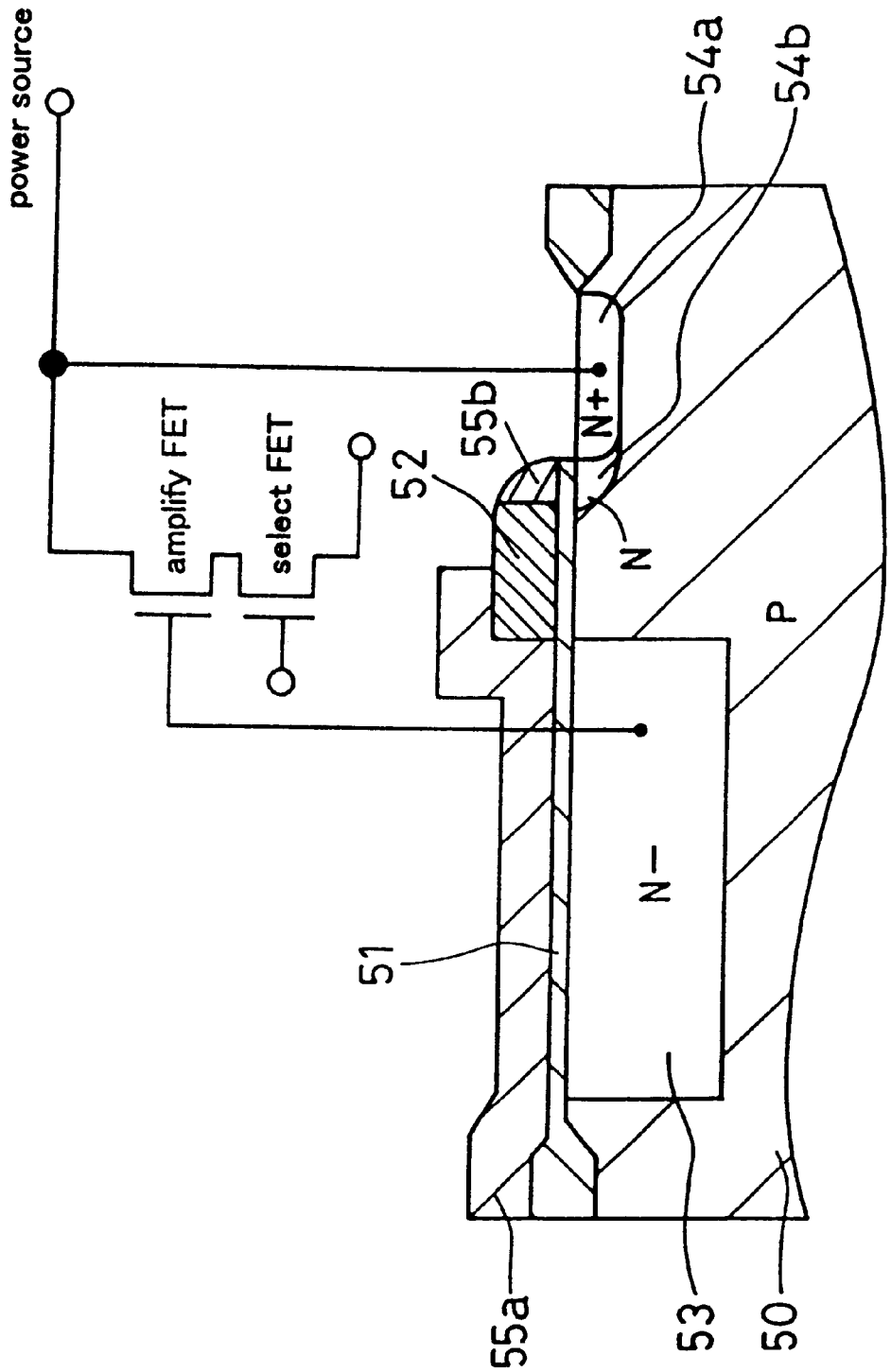
FIG. 6 is a cross-sectional drawing of another example of a solid-state imaging device in accordance with the second embodiment of the present invention.
Figure 7:
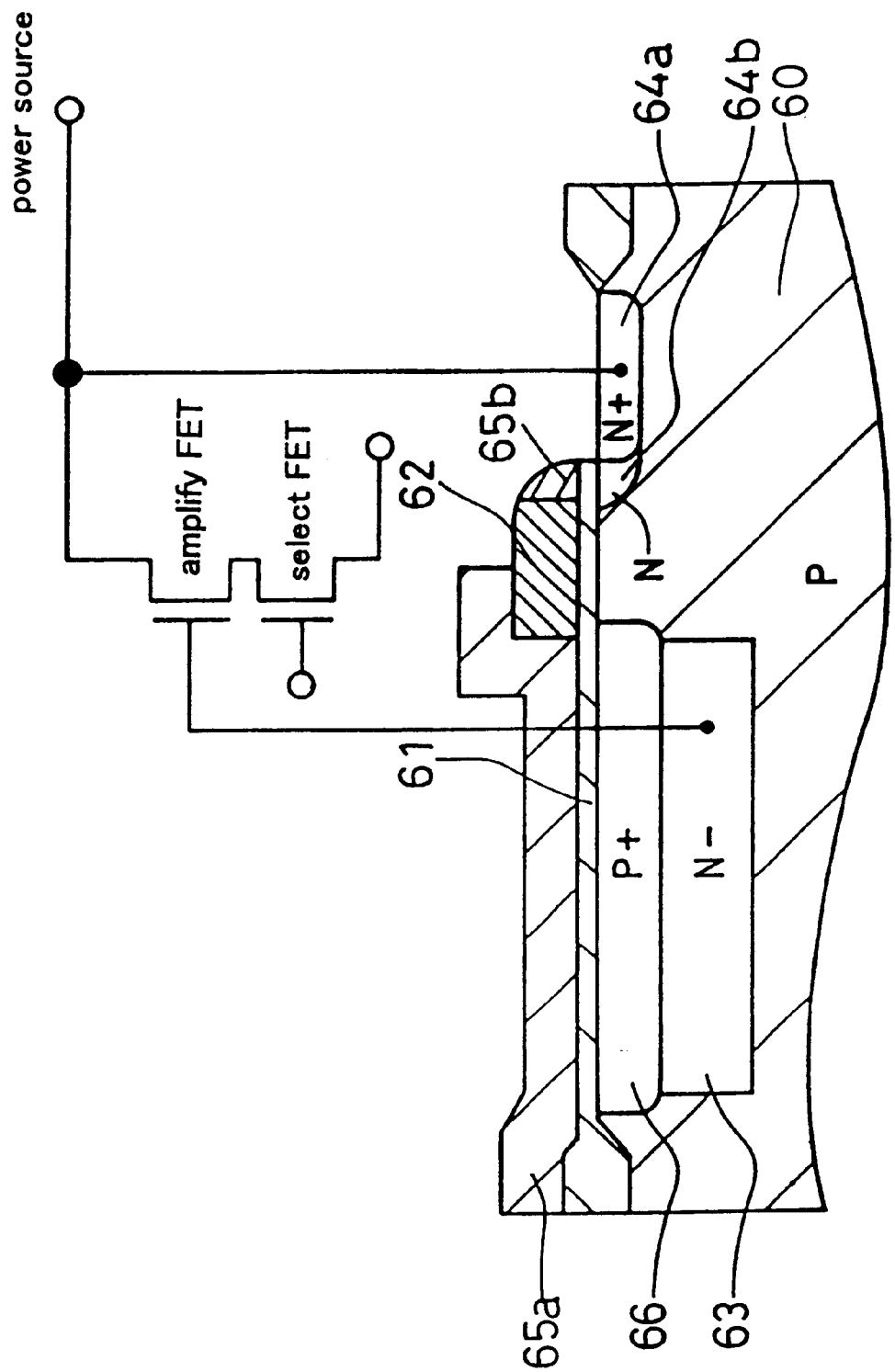
FIG. 7 is a cross-sectional drawing of yet another example of a solid-state imaging device in accordance with the second embodiment of the present invention.

FIG. 6 shows an example of a more preferable embodiment of a solid-state imaging device in accordance with this embodiment. In this solid-state imaging device, the impurity concentration in the photo-receiving portion 53 is even lower than in the solid-state imaging device shown in FIG. 5. Other than that the impurity concentration in the photo-receiving portion 53 is set to be even lower than the impurity concentration in the LDD portion 54b, the configuration of this solid-state imaging device is the same as the configuration of the solid-state imaging device described in FIG. 5. The impurity concentration in the photo-receiving portion 53 is preferably about $10^{15}$–$10^{17}$cm$^{-3}$, and the diffusion depth is preferably about 0.5–2.0 μm. With such an impurity concentration, the photo-receiving portion can be formed with a small ion implantation dose, for example about $10^{11}$–$10^{13}$cm$^{-2}$. FIG. 7 shows an example of another more preferable embodiment of a solid-state imaging device in accordance with this embodiment. Aside from the p-type diffusion region 66 formed at the surface portion of the photo-receiving portion 63, which is an n-type impurity region, this solid-state imaging device has the same configuration as the solid-state imaging device in FIG. 6. For the p-type diffusion region 66, an impurity concentration of $10^{17}$–$10^{19}$cm$^{-3}$ and a diffusion depth of about 0.2–0.6 μm are appropriate.

FIGS. 8(a) to (d) illustrate an example of a method for manufacturing a solid-state imaging device in accordance with this embodiment. The reset transistor of the solid-state imaging device of this embodiment can be formed through practically the same operations as the charge transfer transistor in the first embodiment. In the following, "charge drain portion" means the region 44a in FIG. 5, and "LDD portion" means the region 44b in FIG. 5.

Figure 8:
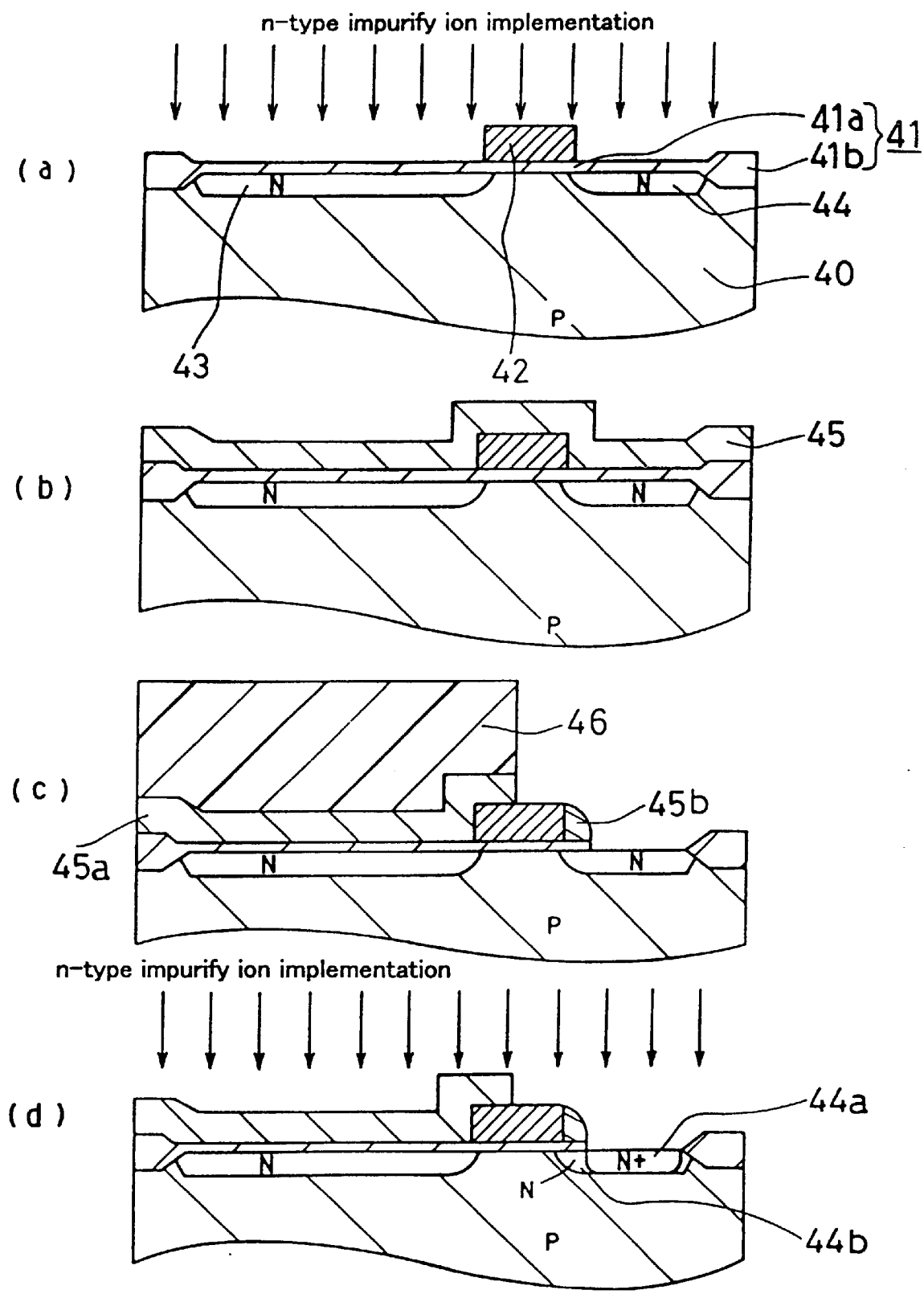
FIGS. 8(a) to 8(d) are cross-sectional drawings illustrating an example of a process for manufacturing a solid-state imaging device in accordance with the second embodiment of the present invention.

First of all, a photo-receiving portion 43, a charge drain portion and an LDD portion are formed in a silicon substrate 40, whereon a gate insulating film 41a and a reset gate electrode 42 have been formed (FIG. 8(a)). However, the impurity concentration in the charge drain portion formed at this stage is lower than the final impurity concentration, and is the same as the impurity concentration in the LDD portion. At this step, ion implantation can be performed at, for example, an acceleration field strength of 50–80 keV, and an implantation dose of $2\times10^{13}$cm$^{-2}$, and is repeated four times while changing the orientation of the substrate.

A silicon oxide film 45 is formed above the substrate (FIG. 8(b)), and partially removed by etching (FIG. 8(c)). This silicon oxide film 45 is formed, for example, by low-pressure CVD using TEOS. Its thickness is preferably 150–250 nm, more preferably 190 nm. The etching is performed in a manner that the silicon oxide film formed above the photo-receiving portion 43 and the LDD portion remains.

Then, the impurity concentration in the charge drain portion is increased to a desired concentration by a further ion implantation (FIG. 8(d)). This ion implantation is performed, for example, at an acceleration field strength of 20–30 keV and an implantation dose of $5\times10^{15}$cm$^{-2}$. Thus, the reset transistor is formed.

An interlayer insulation film is formed above the silicon substrate, whereon the reset transistor has been formed. Then, a hole is formed in the silicon oxide film 45a and the interlayer insulating film above the photo-receiving portion 43 by etching, and a metal film of, for example, aluminum is formed. This metal film is patterned by etching to form metal wiring. This metal wiring connects the photo-receiving portion 43 to the gate electrode of the amplify transistor formed in another region of the silicon substrate, through the hole in the interlayer insulating film. Moreover, after a hole has been formed in the interlayer insulating film above the charge drain portion 44a, another metal film is formed. This metal film is for metal wiring that is patterned to connect the charge drain portion 44a to the power-source voltage, through the hole. Furthermore, a light-blocking film made of metal, and a surface protection film are formed as appropriate, to obtain the solid-state imaging device.

In the above-described manufacturing method, the formation of the photo-receiving portion is performed simultaneously with the formation of the charge drain portion (first ion implantation into the charge drain portion), but the photo-receiving portion and the charge drain portion also can be formed in independent steps. If such a manufacturing method is adopted, first, ions are implanted to form the photo-receiving portion while the region of the semiconductor substrate that becomes the charge drain portion and the LDD portion is covered with photo-resist. Then, the photo-resist is removed, and n-type ions are implanted into the charge drain portion and the LDD portion while another photo-resist covers the photo-receiving portion. Then, the photo-resist is removed, an oxide film is formed and etched, and another ion implantation is performed for the charge drain portion, as in the steps for the above-described manufacturing method (FIGS. 8(b)–(d)).

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, all changes that come within the meaning and range of equivalency of the claims are intended to be embraced therein.

What is claimed is:

1. A method for manufacturing a solid-state imaging device comprising a plurality of pixels, each pixel comprising:

a semiconductor substrate of a first conductivity type;

a photo-receiving portion of a second conductivity type formed in the semiconductor substrate;

a first diffusion region of the second conductivity type formed in the semiconductor substrate;

a first insulating film formed on the semiconductor substrate;

a gate electrode formed on the first insulating film at least between the photo-receiving portion and the first diffusion region;

a read-out circuit, which is electrically connected to either one of the photo-receiving portion and the first diffusion region;

the method comprising:

forming the gate electrode on the first insulating film;

implanting ions into the semiconductor substrate using the gate electrode as a mask and forming the photo-receiving portion and a second diffusion region of the second conductivity type including a region that corresponds to the first diffusion region;

forming a second insulating film directly on the gate electrode above the semiconductor substrate;

etching the second insulating film in a manner that the second insulating film remains above the photo-receiving portion and above a region of the substrate including an end of the second diffusion region near the gate electrode; and implanting ions that are impurities of the second conductivity type into the second diffusion region using the remaining second insulating film as a mask to form the first diffusion region.

2. The method according to claim 1, wherein the impurity concentration in the photo-receiving portion is adjusted to be lower than the impurity concentration in the second diffusion region.

3. The method according to claim 1, further comprising forming a third diffusion region of the first conductivity type at an upper portion of a region in the semiconductor substrate that corresponds to the photo-receiving portion.

4. The method according to claim 1, wherein forming the second insulating film is performed in a manner that the thickness of the second insulating film is 150 nm to 250 nm.

5. The method according to claim 1, wherein etching the second insulating film is performed by dry-thing.

6. The method according to claim 1, wherein the impurity concentration in the first diffusion region is at least $10^{20}$ cm$^{-3}$.

7. The method according to claim 1, wherein the impurity concentration in the photo-receiving portion is $10^{15}$ cm$^{-3}$ to $10^{19}$ cm$^{-3}$.

8. The method according to claim 1, wherein the impurity concentration in the second diffusion region is $10^{18}$ cm$^{-3}$ to $10^{19}$ cm$^{-3}$.

9. A method for manufacturing a solid-state imaging device comprising:

forming a gate electrode on a first insulating film, which is located above a semiconductor substrate having a first conductivity type;

implanting ions into the semiconductor substrate using the gate electrode as a mask, to form a photo-receiving portion of a second conductivity type on a first side of the gate electrode, and to form a second diffusion region of the second conductivity type on a second side of the gate electrode;

forming a second insulating film directly on the gate electrode above the semiconductor substrate;

etching the second insulating film in a manner that the second insulating film remains above the photo-receiving portion and above a region of the substrate including an end of the second diffusion region near the gate electrode; and implanting ions into the second diffusion using the remaining second insulating film as a mask to form the first diffusion region with an impurity concentration that is higher than an impurity concentration in the photo-detection portion.

10. The method according to claim 9, wherein the impurity concentration in the photo-receiving portion is adjusted to be lower than the impurity concentration in the second diffusion region.

11. The method according to claim 9, further comprising forming a third diffusion region of the first conductivity type at an upper portion of a region in the semiconductor substrate that corresponds to the photo-receiving portion.

12. The method according to claim 9, wherein forming the second insulating film is performed in a manner that the thickness of the second insulating film is 150 nm to 250 nm.

13. The method according to claim 9, wherein etching the second insulating film is performed by dry-etching.

14. The method according to claim 9, wherein the impurity concentration in the first diffusion region is at least $10^{20}$ cm$^{-3}$.

15. The method according to claim 9, wherein the impurity concentration in the photo-receiving portion is $10^{15}$ cm$^{-3}$ to $10^{19}$ cm$^{-3}$.

16. The method according to claim 9, wherein the impurity concentration in the second diffusion region is $10^{18}$ cm$^{-3}$ to $10^{19}$ cm$^{-3}$.

17. A method for manufacturing a solid-state imaging device comprising:

forming a gate electrode on a first insulating film, which is located above a semiconductor substrate having a first conductivity type;

forming a photo-receiving portion of a second conductivity type on a first side of the gate-electrode in the semiconductor substrate;

forming a second diffusion region of the second conductivity type on a second side of the gate-electrode in the semiconductor substrate;

forming a second insulating film directly on the gate electrode above the semiconductor substrate;

etching the second insulating film in a manner that the second insulating film remains above the photo-receiving portion and above a region of the substrate including an end of the second diffusion region near the gate electrode; and implanting ions into the second diffusion region using the remaining second insulating film as a mask to form a first diffusion region with an impurity concentration that is higher than an impurity concentration in the photo-receiving portion.

18. The method according to claim 17, wherein the impurity concentration in the photo-receiving portion is adjusted to be lower than the impurity concentration in the second diffusion region.

19. The method according to claim 17, further comprising forming a third diffusion region of the first conductivity type at an upper portion of a region in the semiconductor substrate corresponds to the photo-receiving portion.

* * * * *